United States Patent [19]

Anderson et al.

[11] Patent Number: 4,974,167
[45] Date of Patent: Nov. 27, 1990

[54] ERASABLE DATA ACQUISITION AND STORAGE INSTRUMENT

[75] Inventors: Rolf P. Anderson, Tigard; James B. Proebstel, Beaverton, both of Oreg.

[73] Assignee: Tektronix, Inc., Beaverton, Oreg.

[21] Appl. No.: 317,701

[22] Filed: Feb. 28, 1989

[51] Int. Cl.[5] .................. G06F 15/20; G06F 12/14
[52] U.S. Cl. .................................. 364/487; 324/113; 364/480; 364/900
[58] Field of Search ............... 371/12, 13, 21.1, 21.2, 371/22.5; 364/200, 900, 480, 481, 484–487; 324/77 R, 78 E, 113; 365/218

[56] References Cited

U.S. PATENT DOCUMENTS

| | | | |
|---|---|---|---|
| 4,072,851 | 2/1978 | Rose | 364/487 |
| 4,393,500 | 7/1983 | Imazeki et al. | 371/13 |
| 4,517,663 | 5/1985 | Imazeki et al. | 371/13 |
| 4,654,849 | 3/1987 | White, Jr. et al. | 371/21.1 |
| 4,703,433 | 10/1987 | Sharrit | 364/487 |
| 4,805,151 | 2/1989 | Terada et al. | 371/21.1 |
| 4,812,996 | 3/1989 | Stubbs | 364/487 |
| 4,878,194 | 10/1989 | Nakatsugawa et al. | 364/487 |

Primary Examiner—Kevin J. Teska
Attorney, Agent, or Firm—John P. Dellett; Francis I. Gray

[57] ABSTRACT

A digital oscilloscope includes an acquisition system for digitizing an input signal to produce and store in memory a waveform data sequence representing the input signal. A display system within the instrument reads out and processes the data stored in the memory to produce a waveform display representing the input signal. The instrument responds to an input "erase" command from a user by overwriting the waveform data sequence stored in memory with a predetermined data sequence defining an easily recognizable display pattern. The oscilloscope thereafter performs a checksum operation on overwritten portions of memory to determine whether the overwrite operation was successful, and displays an indication of overwrite success on its screen.

19 Claims, 8 Drawing Sheets

TEKSECURE ERASE MEMORY STATES: ERASED

| MEM BLOCK | STATUS |
|---|---|
| SAVE PAGE 1 | ERASED |
| SAVE PAGE 2 | ERASED |
| SAVE PAGE 3 | ERASED |
| SAVE PAGE 4 | ERASED |
| DISP. MEM. | ERASED |
| ACQ. MEM. | ERASED |
| MISC. MEM. | ERASED |
| SEQ. MEM. | ERASED |
| LOCAL RAM 1 | ERASED |
| LOCAL RAM 2 | ERASED |
| LOCAL RAM 3 | ERASED |

4,974,167

ERASABLE DATA ACQUISITION AND STORAGE INSTRUMENT

BACKGROUND OF THE INVENTION

The present invention relates in general to instruments for acquiring, storing and displaying data representing input signals, and in particular to an instrument permitting a user to erase such data easily when stored in memory.

A typical digital storage oscilloscope includes an acquisition system for generating waveform data sequences representing magnitudes of successive samples of input signals. The oscilloscope further includes a memory for storing acquired data sequences and a system for generating waveform displays on a cathode ray tube (CRT) screen depicting the stored waveform data. The oscilloscope may also store and display additional data regarding each displayed waveform such as range settings and sampling rates. Such oscilloscopes may use non-volatile memory for storing waveform data sequences and other data so that the data is retained when the oscilloscope is turned off or unplugged. "Non-volatile" memory is defined herein as read and write accessible memory that retains its data when the system that read and write accesses that memory loses its power source, while volatile memory is one that loses its contents when the system that accesses it loses its power. Oscilloscopes typically use battery driven non-volatile memory although other varieties of non-volatile memory may be employed.

When information stored in an oscilloscope involves valuable trade secret data, the storage oscilloscope represents a security problem, particularly when the oscilloscope uses non-volatile memory for storing the data. To prevent others from accessing sensitive data in an oscilloscope, a user may wish to erase the data from the oscilloscope memory before leaving the oscilloscope unattended, allowing another person to use it, or removing it from a secure work site. Digital storage oscilloscopes of the prior art, employing volatile or non-volatile memory can "erase" waveform data sequences and other data stored in the memory by writing over that data with newly acquired data. Furthermore, to "erase" important waveform data stored in an oscilloscope using only volatile memory, a user can simply turn the oscilloscope off. However, when the oscilloscope employs non-volatile memory, a user can only erase important data therein by using the oscilloscope in such a way that this data is written over. Such a procedure is time-consuming and difficult to perform, particularly by security personnel not familiar with oscilloscope operation. In addition, there can be areas of memory storing sensitive information that are inaccessible to the user when operating the oscilloscope in a normal fashion.

Similar security problems occur with instruments such as spectrum and logic analyzers that generate and store data representing various observed phenomena

SUMMARY OF THE INVENTION

The present invention relates to an instrument such as a digital storage oscilloscope including an acquisition system for digitizing an input signal to produce and store in memory waveform data sequences representing input signals and other data needed to interpret the sequences. A display system in the instrument reads out and processes the data sequences stored in the memory to produce displays portraying the input signals. In accordance with an aspect of the invention, the instrument responds to an input "erase" command from a user by overwriting the waveform data sequences and other data with predetermined data.

In accordance with another aspect of the invention, the waveform data sequences are overwritten with predetermined data sequences defining an easily recognizable display pattern. Thereafter, when the display system is requested to generate a display based on the data now stored in memory, the predetermined pattern appears.

In accordance with a further aspect of the invention, after the instrument overwrites the data in memory in response to the erase command, it performs operations to verify that all data in the instrument memory that were supposed to have been overwritten have been properly overwritten. The instrument then displays results of such verification operations. Thus, the invention enables a user easily to overwrite sensitive data in volatile and non-volatile memory within the instrument using a simple command, and to ensure that the sensitive data have been overwritten by observing the resulting display generated by the instrument.

It is accordingly an object of the invention to provide an improved instrument for acquiring, storing and displaying data representing input signals, which instrument permits a user easily to write over the stored data.

It is another object of the invention to provide such improved instrument that permits a user easily to determine whether data stored in the oscilloscope has been properly written over.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

The preferred embodiment of the present invention relates to an improved digital storage oscilloscope that enables a user easily to erase acquired waveform and other data stored in volatile and non-volatile memory within the oscilloscope. Relevant features of a prior art oscilloscope are first described hereinbelow and improvements to the prior art oscilloscope in accordance with the present invention are described thereafter.

Figure 1:
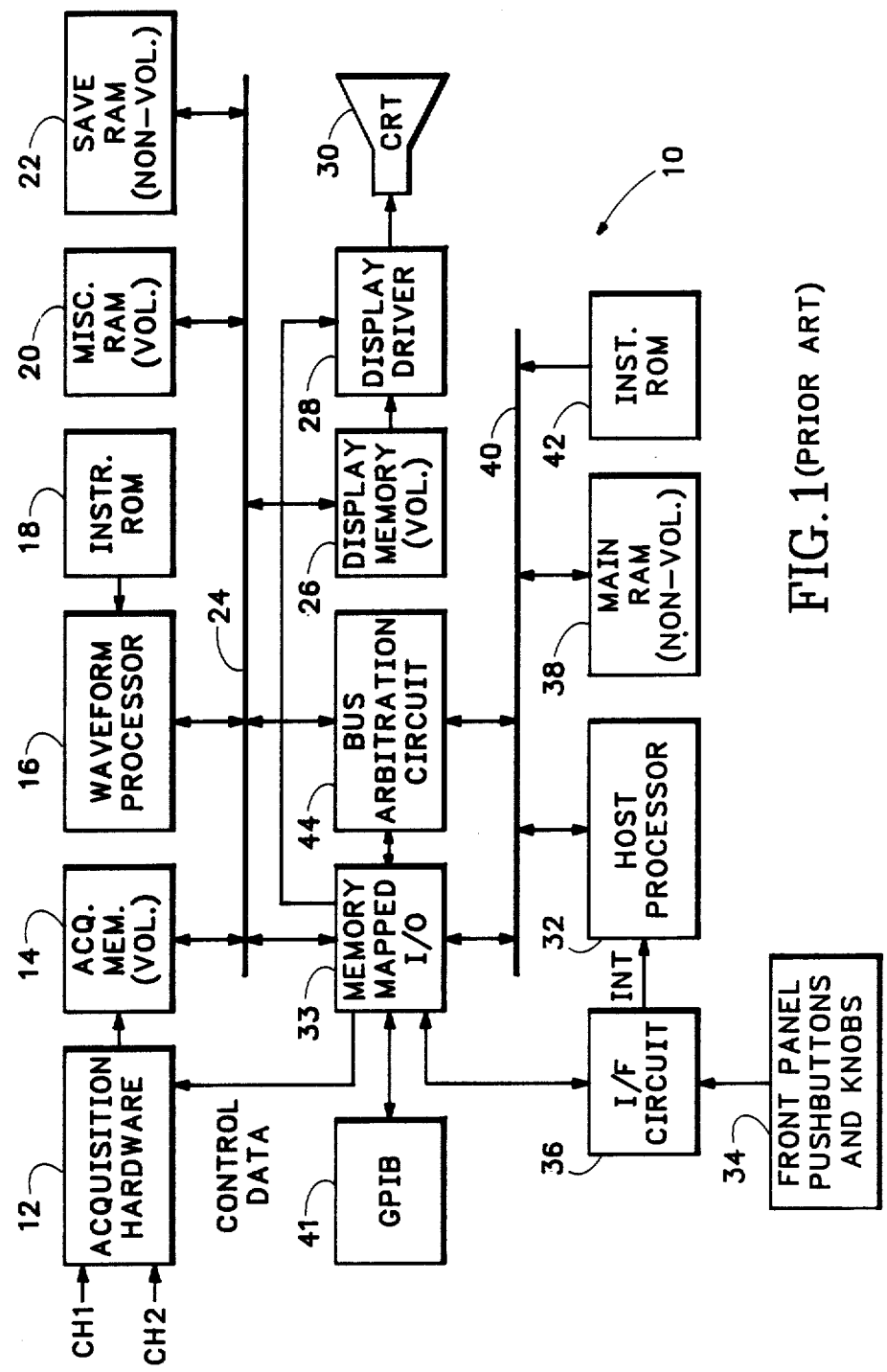
FIG. 1 is a block diagram of a typical digital storage oscilloscope suitable for implementing the present invention.

Referring to FIG. 1, a digital storage oscilloscope 10 of the prior art (suitably a Tektronix model 2440) comprises acquisition hardware 12 for digitizing channel 1 and channel 2 (CH1 and CH2) input signals to produce waveform data sequences representing the input signals. An acquisition memory 14 temporarily stores each data sequence as acquired. A bus 24 interconnects acquisition memory 14, a waveform processor 16, a volatile "miscellaneous" random access memory 20, a non-volatile "save" random access memory 22, and a volatile display memory 26. The waveform processor 16, operating under instructions in an instruction ROM 18, and in response to commands stored in miscellaneous memory 20, processes waveform data sequences stored in acquisition memory 14 and stores the processed waveform data sequences in save memory 22.

The display memory 26 stores a vector list for each waveform display produced on the screen of a cathode ray tube (CRT) 30. It also stores data defining other parts of the display such as text and graphics. A display driver 28 periodically reads the vector lists and other data stored in display memory 26 and updates the display on CRT 30 accordingly. The display may include waveforms, parameters relating to displayed waveforms, menus and various other text and graphical displays. To initiate a display of waveforms representing particular data sequences stored in save memory 22, the waveform processor 16 reads out and further processes the particular data sequence to produce vector lists defining the waveforms. The waveform processor 16 stores the vector lists in display memory 26. When display driver 28 thereafter updates the display on CRT 30 in accordance with the vector lists stored in memory 26, the waveform appears on CRT 30. The waveform processor 16 controls operation of the display driver 28 by sending commands to registers within the display driver through a memory-mapped I/O circuit 33 connected to bus 24.

The non-volatile save memory 22 has space for storing two sequences labeled CH1 and CH2 representing last digitized input signals of the two oscilloscope input channels. Save memory 22 also has space for storing up to four "reference" sequences labeled REF1-REF4. The waveform processor 16 may create a reference sequence by copying either of the two sequences CH1 and CH2 stored in save memory 22 into another area of save memory 22 reserved for one of the reference sequences REF1-REF4. The waveform processor may subsequently display a waveform representing a selected reference sequence REF1-REF4 by reading the selected reference sequence out of save memory 22 and processing the sequence to generate a vector list for storage in display memory 26. Since the save memory 22 is non-volatile, the last acquired CH1 and CH2 sequences and the current REF1-REF4 reference sequences remain in memory after the oscilloscope is turned off. When an operator subsequently turns on the oscilloscope, the "saved" waveforms may be re-displayed.

A host processor 32 (in the preferred embodiment, a Motorola model 6809 microprocessor) controls oscilloscope operation in response to user input through pushbuttons and knobs 34 on the oscilloscope front panel and communicates with the user by initiating display of menus and data on the oscilloscope screen. The host processor 32 operates under instructions stored in an instruction ROM 42 and makes use of a non-volatile "main" random access memory 38 for storing data. Host processor 32, main memory 38 and instruction ROM 42 communicate through a host processor bus 40. When the user operates a pushbutton or knob 34, an interface (I/F) circuit 36 generates and stores data describing the pushbutton or knob operation. Interface circuit 36 then transmits an interrupt signal (INT) to host processor 32. The host processor 32 thereupon executes an interrupt routine wherein it read accesses the data stored in interface circuit 36 via memory mapped I/O circuit 33 connected to the host processor through the host processor bus 40. When the host processor 32 determines from the interface data which pushbutton or knob has been operated, the host processor 32 executes an appropriate routine stored in instruction ROM 42. Some of these routines stored in ROM 42 tell the host processor 32 to adjust operating parameters of acquisition hardware 12 such as digitizing rate, vertical range setting, and trigger level. The host processor 32 makes such adjustments by sending control data to acquisition hardware 12 via the memory mapped I/O circuit 33. Other routines in instruction ROM 42 enable the host processor 32 to communicate with external equipment through a general purpose interface bus (GPIB) 41 via memory mapped I/O circuit 33.

Still other interrupt routines called in response to pushbutton or knob operation tell the host processor 32 to send commands to the waveform processor 16. For example, a command may tell the waveform processor 16 to save one of the CH1 and CH2 sequences as a reference sequence REF1-REF4. A bus arbitration circuit 44 interconnects the host processor bus 40 to the waveform processor bus 24. When the host processor 32 sends a command to the waveform processor 16, it first obtains control of the waveform processor bus 24 via bus arbitration circuit 44. The host processor 32 then directly writes the command into miscellaneous memory 20 and thereafter relinquishes control of waveform processor bus 24. The waveform processor 16 subsequently reads out and executes the command stored in miscellaneous memory 20. Other routines called in response to user input tell host processor 32 to alter display of menus, graphics or data on CRT 30. The host processor 32 does this by first arbitrating for control of the waveform processor bus 24. Upon obtaining control of bus 24, processor 32 transmits appropriate character strings or other data for storage in display memory 26 via bus arbitration circuit 44 and bus 24.

Figure 2:
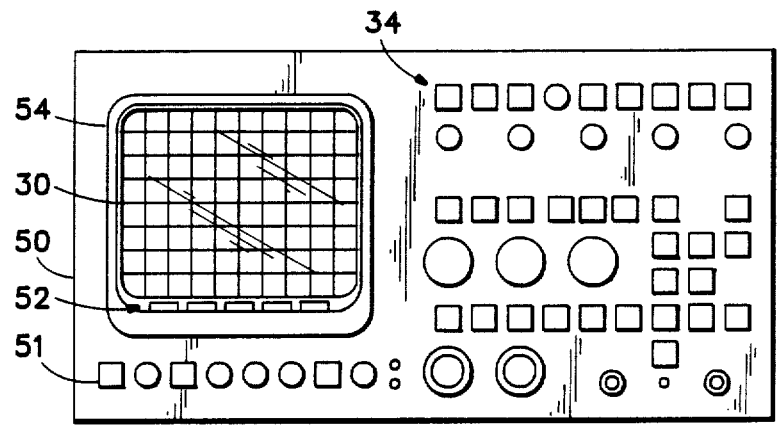
FIG. 2 is front view of a typical digital storage oscilloscope.

FIG. 2 illustrates a front panel 50 for the oscilloscope of FIG. 1 including various pushbuttons and knobs 34. The oscilloscope may display any selected one of a hierarchy of menus along the lower edge of the screen of CRT 30. A menu on/off front panel pushbutton 51 controls the display of a currently selected menu. A set of five "menu" pushbuttons 52 mounted on the lower edge of a bezel 54 surrounding the screen of CRT 30 allows a user to select menu items displayed on the screen directly above menu pushbuttons 52. FIGS.

3A-3D show various menus that may be displayed. The particular routine executed by host processor 32 of FIG. 1 in response to operation of a menu pushbutton 52 depends on the menu item currently appearing above the pushbutton.

Figure 6A:
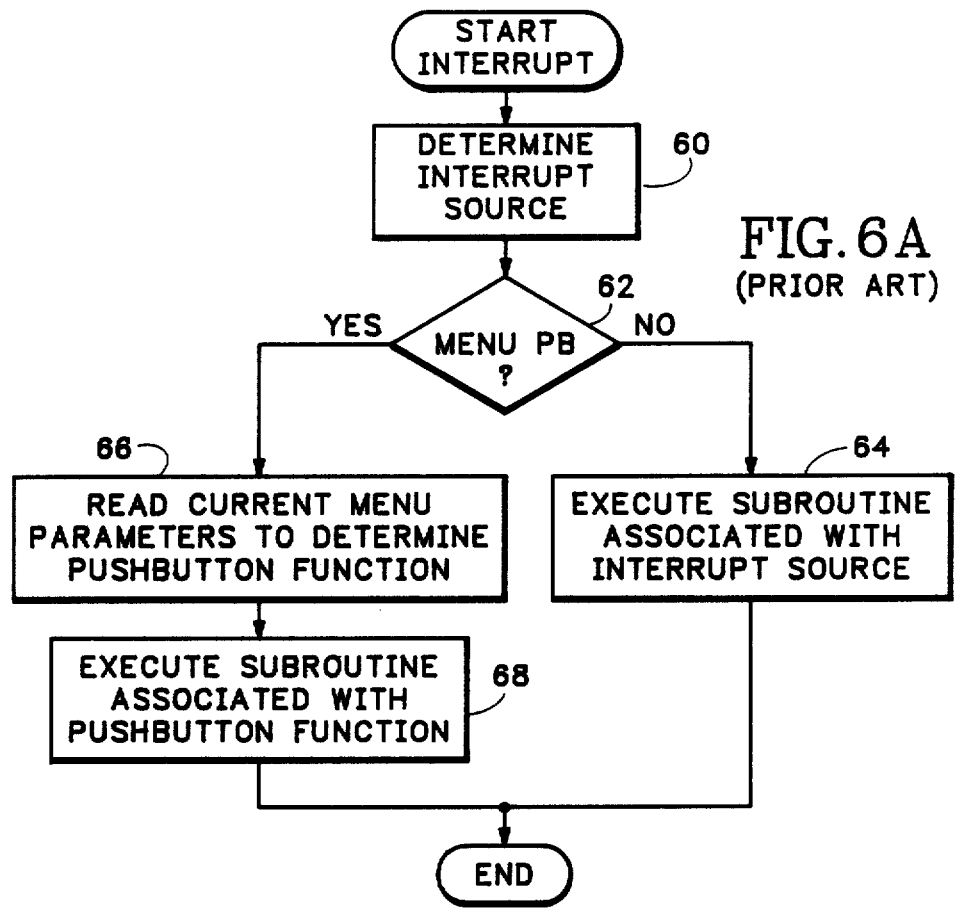

FIG. 6A illustrates a prior art routine executed by the host processor 32 in response to an interrupt from interface circuit 36 of FIG. 1. The host processor first reads data from the interface circuit 36 to determine the source of the interrupt, i.e., the particular knob or pushbutton operated (step 60). If a knob or pushbutton other than one of the menu pushbuttons 52 of FIG. 2 (step 62) initiated the interrupt, the processor executes a routine in the instruction ROM associated with the interrupt source (step 64). For example, if a knob was rotated or pushbutton operated, the processor may update a front panel setting parameter stored in main memory 38 of FIG. 1 indicating current position of the knob or pushbutton. When the routine associated with the operated pushbutton or knob returns to the interrupt routine, the interrupt routine ends. Alternatively, when at step 62 the processor determines the interrupt source was one of the menu pushbuttons 52 of FIG. 2, the processor reads "current menu" parameters previously stored in main memory 38 of FIG. 1 indicating menu items currently displayed and determines therefrom a routine associated with the selected menu item (step 66). After the processor executes the associated routine (step 68), the interrupt routine ends.

Figure 6B:
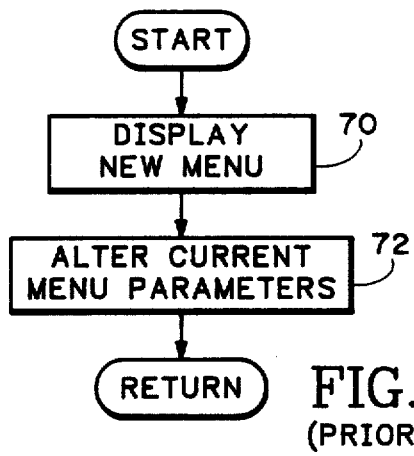

FIG. 6B illustrates a prior art routine executed by the host processor at step 68 of FIG. 6A when the menu item selected by a user references another menu. At step 70 the routine initiates display of the other menu, and at step 72 the routine alters current menu parameters stored in main memory 38 to indicate the other menu is now displayed. The routine then returns to the interrupt routine.

Figure 4:
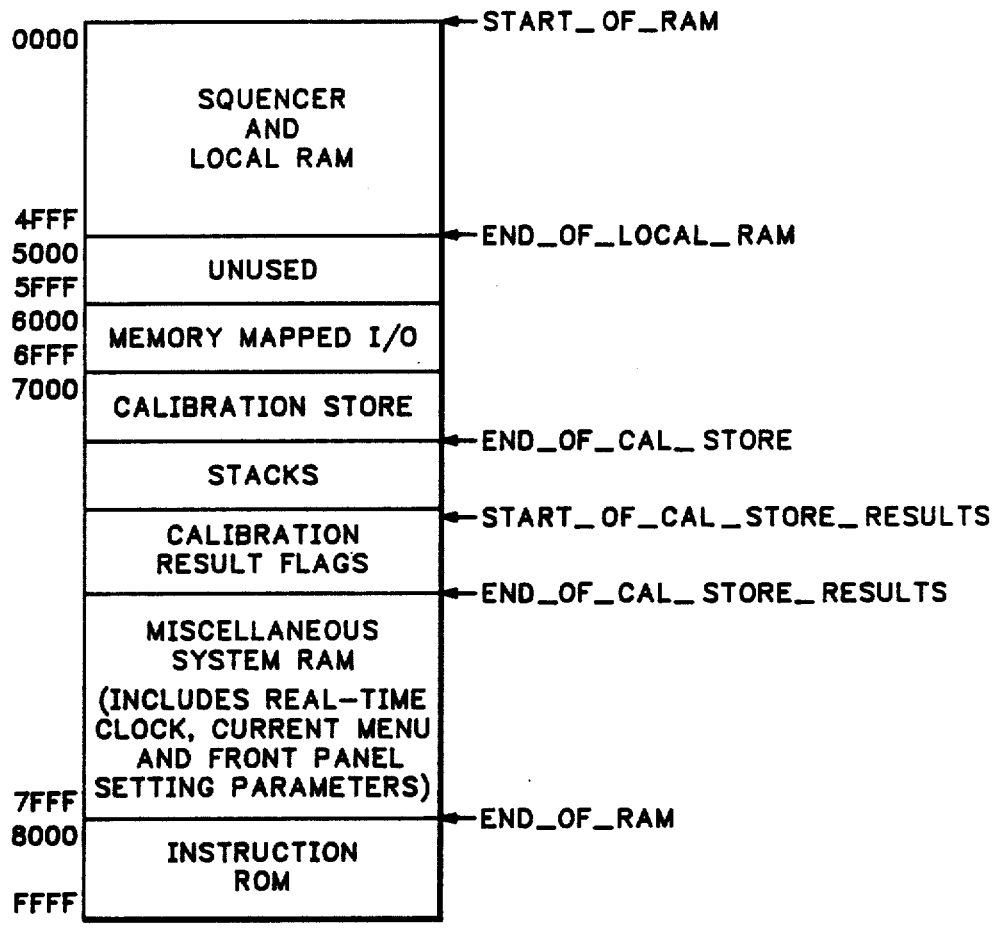
FIG. 4 is a diagram illustrating mapping of addressable resources to the address space of the host processor bus of FIG. 1.
Figures 5, 10:
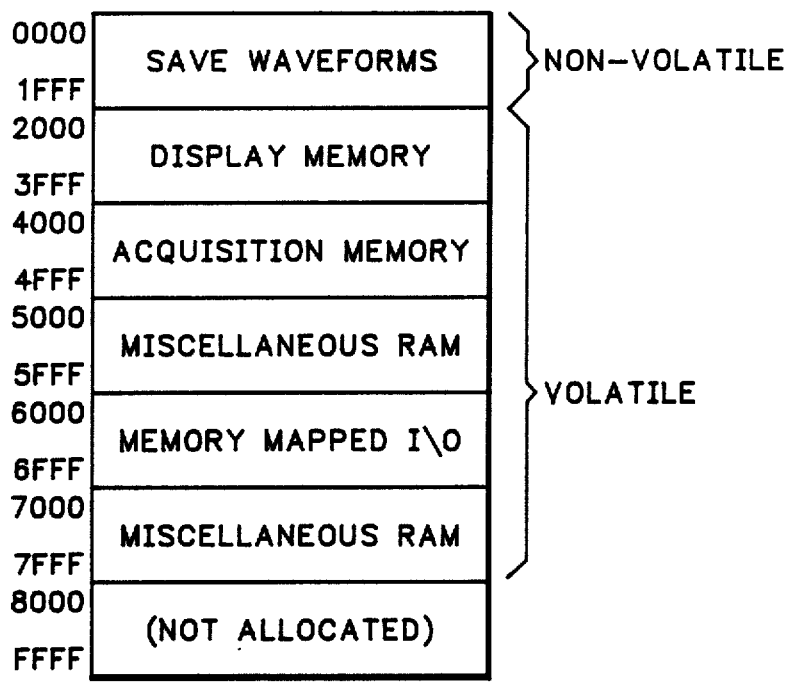
FIG. 5 is a diagram illustrating mapping of addressable resources to the address space of the waveform processor bus of FIG. 1, FIGS. 6A and 6B are flow charts illustrating an interrupt routine executed by the host processor of FIG. 1 in response to an interrupt from the front panel interface circuit.
FIG. 10 depicts a display produced by the restart routine of FIG. 9.

As previously discussed, oscilloscope 10 of FIG. 1 includes two computer busses, the waveform processor bus 24 and the host processor bus 40. FIG. 4 illustrates allocation of address space on the host processor bus 40 and FIG. 5 illustrates allocation of address space on the waveform processor bus 24. Following system start up, when not otherwise executing an interrupt routine, the host processor 32 executes a "sequencer" routine stored in instruction ROM 42 whereby the host processor repetitively carries out a sequence of operations defined by the sequencer data stored in main memory 38. The sequencer data, and therefore the sequence of operations being performed, may change from time to time in response to user input. Referring to FIGS. 1 and 4, host processor 32 uses "Sequencer" and "Local RAM" areas of non-volatile main memory 38 extending from address 0000 to 0FFF(hex) for storing sequencer and other data and when executing various routines In the preferred embodiment, addresses 5000-5FFF of the host processor bus 40 address space are unused, not allocated to any hardware connected to the bus. Addresses 6000-6FFF are allocated to addressable storage devices within the memory mapped I/O circuit 33.

Addresses 7000-7FFF of the host processor bus 40 address space are mapped to storage locations in non-volatile main memory 38 storing several different types of information. For example, a "calibration store" area contains data updated whenever the oscilloscope is calibrated. The host processor consults the calibration data in the course of adjusting settings of acquisition hardware 12. Addresses 7000-7FFF also include an area reserved for calibration results flags. These flags indicate whether various calibration operations were successful when last performed. The processor consults these flags during system startup and generates a display on the oscilloscope screen indicating the current state of oscilloscope calibration.

The miscellaneous RAM portion of main memory 38 between address 7000 and 7FFF also stores "header" data associated with each waveform data sequence CH1, CH2 and REF1-REF4 stored in save memory 22. The header data contains information about the associated waveform data sequence, including, for example, the digitizing frequency, range settings, and trigger level used when acquiring the waveform data sequence. When the host processor 32 changes the settings of acquisition hardware 12 to alter the manner in which the CH1 or CH2 data sequences are acquired, and new data is acquired, the host processor changes the associated header data accordingly. Also, when the host processor stores a copy of a CH1 or CH2 sequence in save memory 22 as a reference sequence REF1-REF4, it copies the associated header information from one area in miscellaneous RAM to another. When the oscilloscope displays a waveform based on a CH1 CH2 or REF1-REF4 sequence, the host processor 32 may send data to the display memory to generate a concurrent display of text or graphics in accordance with the associated header data. The concurrent text or graphics display enables a user to determine, for example, the vertical and horizontal scale of the waveform display.

Other parts of non-volatile main memory 38 between addresses 7000 and 7FFF implement conventional memory stacks as needed during oscilloscope operation and are used as miscellaneous system RAM for storing various data such as current front panel setting parameters, current menu parameters, and a "real-time clock" parameter. The host processor periodically increments the real-time clock parameter while the oscilloscope is turned on. The real-time-clock parameter therefore indicates total operating time for the oscilloscope. Instruction ROM 42 is mapped to addresses 8000-FFFF on the host processor bus 40.

FIG. 5 illustrates how resources are mapped to the address space associated with the waveform processor bus 24. Waveform data sequences CH1, CH2 and REF-1-REF4 are stored in paged, non-volatile save waveform memory at addresses 0000-1FFF. All other storage devices connected to bus 24 are volatile. Display memory 26 spans addresses 2000-3FFF, acquisition memory 14 covers addresses 4000-4FFF, and miscellaneous memory 20 includes addresses 5000-5FFF and address 7000-FFFF. Addresses 6000-6FFF are mapped to devices within memory mapped I/O circuit 33.

As illustrated in FIGS. 4 and 5, the waveform data sequences and all data accessed through the host processor bus, including program instructions, header information associated with the waveform data sequences, calibration data, current front panel knob and pushbutton setting parameters, realtime clock data and other important data are stored in ROM or non-volatile RAM. When a user turns off the oscilloscope or when the oscilloscope loses its source of power, this data is preserved and is available when the user subsequently turns on the oscilloscope. Thus, following system startup, the oscilloscope need not be re-calibrated, the front panel settings remain unchanged, and the real-time clock routine continues counting where it left off. In addition, since waveform sequences and header data were preserved, the oscilloscope can regenerate its display on CRT 30 substantially as it appeared before the oscilloscope was shut off.

Thus, the non-volatile RAM allows the oscilloscope to preserve acquired waveform data and important calibration and other data while it is turned off. However, when waveform information stored in non-volatile RAM is of a confidential nature, the storage oscilloscope represents a security risk. In such case, a user may wish to remove sensitive information from the oscilloscope before leaving it unattended, allowing another person to use it, or removing it from a secure site. In accordance with the preferred embodiment of the invention, the oscilloscope employs a routine that responds to an input "erase" command from a user by overwriting the waveform data stored in the save memory 22 with data representing a predetermined pattern which may be termed a "zap" pattern. Also, in response to the erase command, the routine erases (sets to zero) or initializes with data stored in ROM the contents of all nonvolatile RAM storage locations other than those locations storing data that should be preserved for proper oscilloscope operation, such as the realtime clock parameter and the calibration data and flags. The routine also checks whether the data was properly erased or overwritten and displays results of the check on the oscilloscope screen.

Figure 3A:
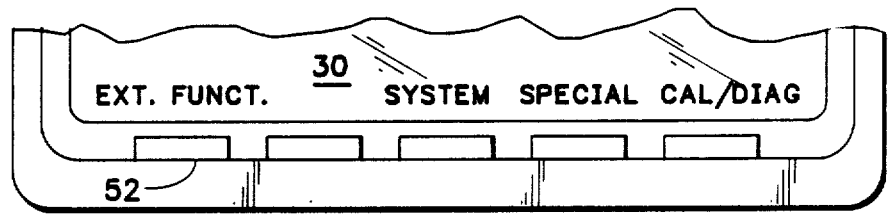
FIGS. 3A–3D are illustrations of menu displays for the oscilloscope of FIG. 2.
Figure 3B:
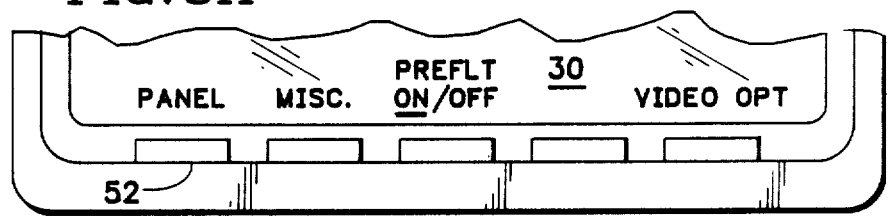
Figure 3C:
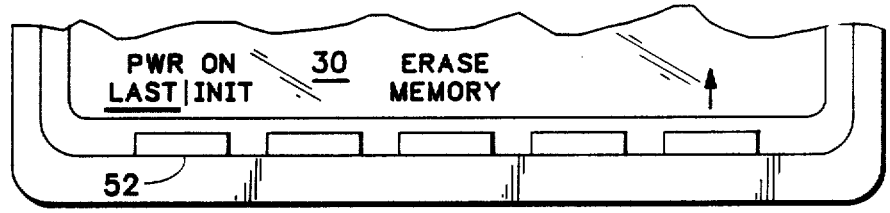
Figure 3D:
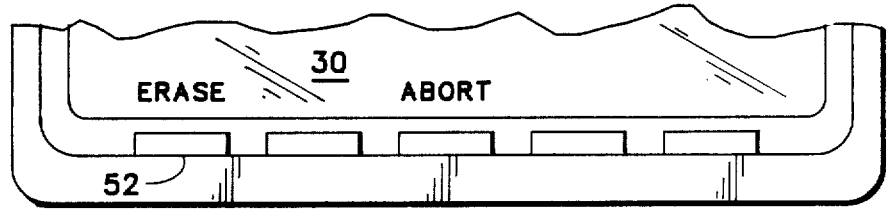

In the preferred embodiment, the user issues the erase command by selecting an "erase" menu item displayed on the oscilloscope screen. Menus are hierarchical and FIG. 3A illustrates the topmost menu of the menu hierarchy. When the user depresses the menu push-button 52 directly under a "SYSTEM" item in the menu of FIG. 3A, the oscilloscope displays the "system" menu illustrated in FIG. 3B. When the menu push-button 52 directly under the "PANEL" menu item of the system menu is pressed, the oscilloscope displays a "panel" menu as shown in FIG. 3C. If the user then depresses the menu push-button 52 under an "ERASE MEMORY" menu item of the panel menu, the oscilloscope displays the "erase" menu illustrated in FIG. 3D. When the user presses the menu pushbutton 52 under the "ABORT" item of the erase menu of FIG. 3D, the panel menu of FIG. 3C is re-displayed. However, when the user presses the menu pushbutton 52 under the "ERASE" item of the erase menu of FIG. 3D, the oscilloscope executes an erase routine illustrated in FIG. 7.

Figure 7:
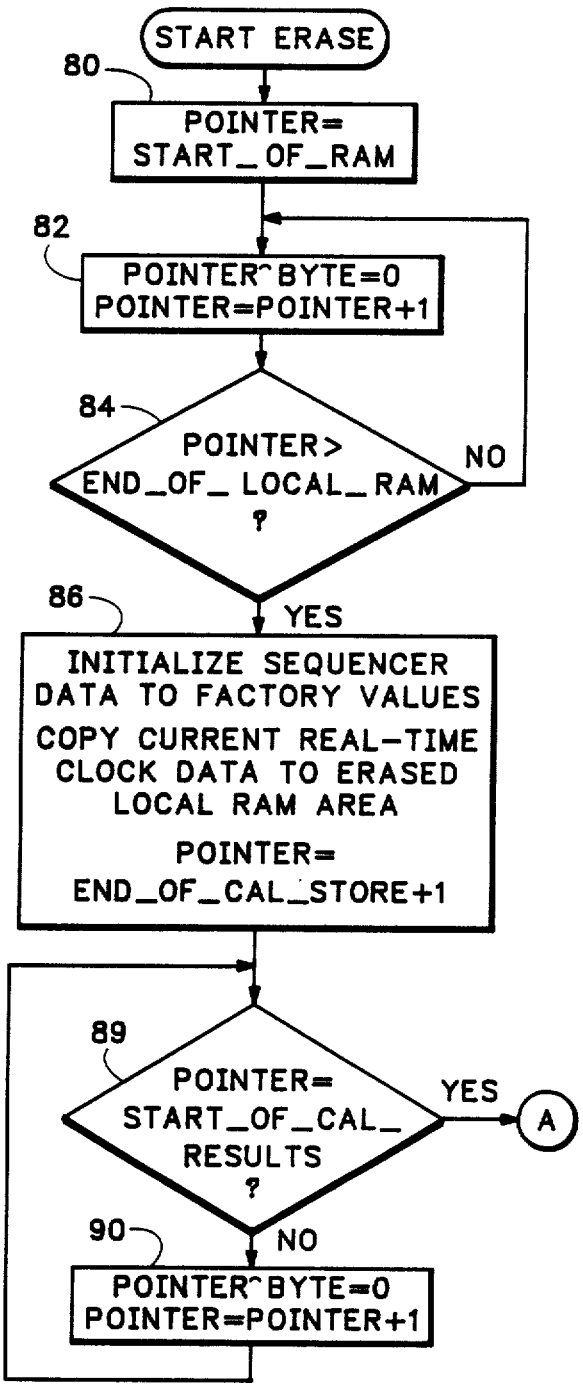
FIG. 7 is a flow chart illustrating an erase routine in accordance with the present invention.
Figure 7:
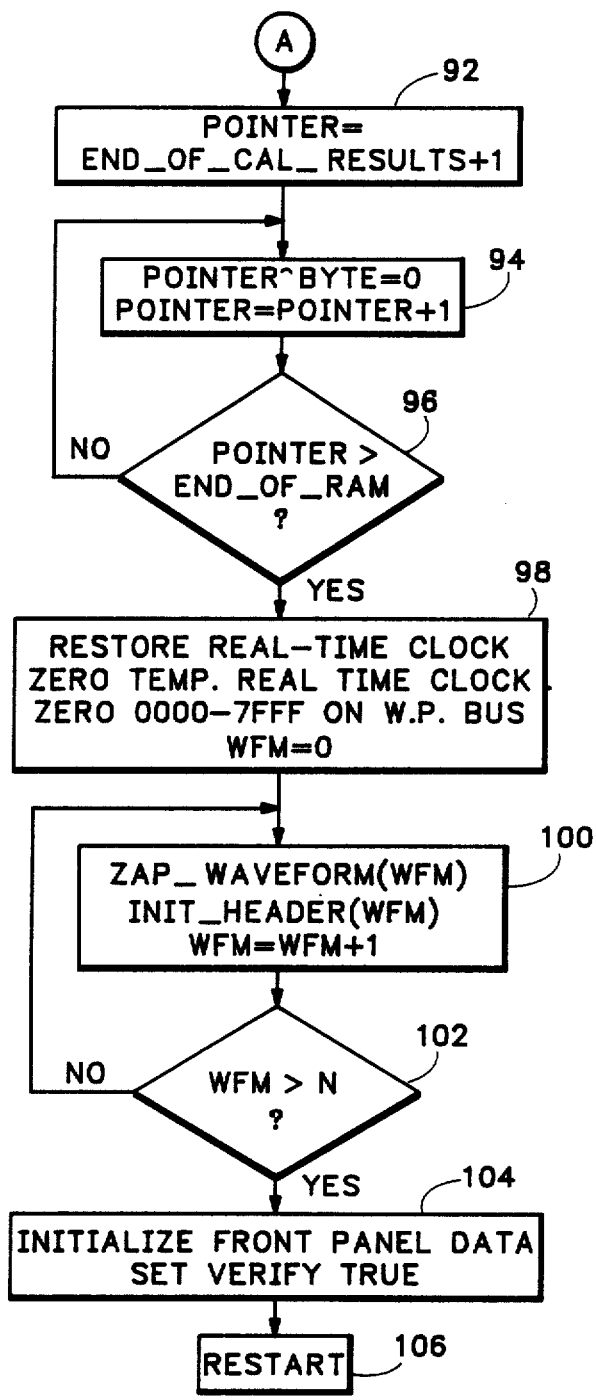

The erase routine, stored in instruction ROM 42 of FIG. 1, writes over data in every portion of volatile and non-volatile memory except calibration and real time clock data. Referring to FIG. 7 and also to FIG. 4, the erase routine initially (at step 80) sets a pointer (POINTER) equal to a parameter START_OF_RAM, the starting address (0000) of non-volatile main memory 38 of FIG. 1. The routine then sets the contents of that address (POINTER^.BYTE) equal to zero and increments POINTER (step 82). If at step 84 POINTER is not yet greater than a parameter END_OF_LOCAL_RAM, address 4FFF in FIG. 4, the routine returns to step 82, thereby zeroing the contents at the next address of main memory 38 and incrementing POINTER once again. The routine repeats steps 82 and 84 until the contents of addresses 0000-4FFF are set to zero. Then, at step 86 the routine sets the contents of certain data storage locations accessed by the sequencer routine to various "factory" values. These values indicate the initial sequence of operations to be performed by the sequencer routine prior to any user input and are the values initially stored in non-volatile RAM when the oscilloscope was first shipped from the factory.

Also, at step 86 the erase routine copies the current value of the real-time clock parameter into a predetermined address within local RAM to temporarily save that parameter while other areas of non-volatile RAM are being erased, including the memory locations used for storing the real-time clock parameter. At step 86, the erase routine also sets POINTER equal to END_OF_CAL_STORE+1, the first address of the "stacks" storage area shown in FIG. 4. Thereafter, (step 88), the erase routine determines whether POINTER is equal to START_OF_CAL_RESULTS, the starting address of the calibration results area of FIG. 4. If not, the erase routine zeros the data stored at the POINTER address, increments POINTER (step 90) and returns to step 88. When contents of all non-volatile RAM addresses reserved for stacks have been zeroed, the erase routine moves from step 88 to step 92. At step 92 the erase routine sets POINTER equal to END_OF_CAL_RESULTS+1, the first address of miscellaneous system RAM as indicated in FIG. 4. The erase routine then sets the contents of that address (POINTER^.BYTE) equal to zero and increments POINTER (step 94). If at step 96 POINTER is not yet greater than a parameter END_OF_RAM (address 7FFF in FIG. 4), the routine repeats step 94, thereby zeroing the contents at the next address of main memory 38 and incrementing POINTER once again. The erase routine repeats steps 94 and 96 until POINTER exceeds 7FFF.

At this point the erase routine, having erased the REAL-TIME CLOCK parameter from its normal storage location in miscellaneous system RAM, restores it to its previous value by copying it back from its temporary storage location in local RAM, writes over with zero (zeros) the contents of the temporary storage location, and zeros the contents of every storage location 0000-7FFF on the waveform processor bus (step 98).

Figure 8:
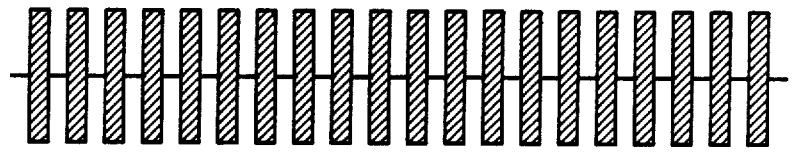
FIG. 8 illustrates a "zap" pattern waveform.

Also, at step 98 the erase routine sets a parameter WFM equal to 1. The waveform data sequences WFM = 1 and 2 refer to the CH1 and CH2 data sequences, respectively, and waveform data sequences 3-6 refer to reference sequences REF1-REF4, respectively. At step 100, the routine calls two routines, ZAP_WAVEFORM(WFM) and INIT_HEADER(WFM) and then increments WFM. The ZAP_WAVEFORM(WFM) writes a "zap" pattern data sequence into the area of non-volatile save memory 22 of FIG. 1 reserved for waveform data sequence WFM. A suitable zap pattern sequence defines an easily identifiable pattern on the oscilloscope screen when displayed. For example, a zap pattern sequence consisting of repeating sets of 25 zeros followed by 25 alternating positive and negative values defines the "zap" waveform display illustrated in FIG. 8.

The INIT_HEADER(WFM) routine initializes the header data in main memory 38 of FIG. 1 associated with waveform WFM to predetermined values. After replacing waveform sequence WFM = 1 with the zap pattern sequence and incrementing WFM, the erase routine checks whether WFM exceeds N, the maximum number (6) of sequences stored in the save memory. If WFM does not exceed N, the routine repeats step 100 replacing the next waveform sequence with the zap pattern sequence and initializing the associated header data. The erase routine repeats steps 100 and 102 until it has replaced all waveform sequences with the zap pattern sequence and has initialized all the header data. The erase routine then initializes current front panel setting parameters stored in the miscellaneous system RAM area of non-volatile main memory 38 of FIG. 1 to predetermined "factory" values and sets a VERIFY flag true (step 104). The erase routine finally jumps to a restart routine (step 106) normally used to boot the oscilloscope on system startup.

Figure 9:
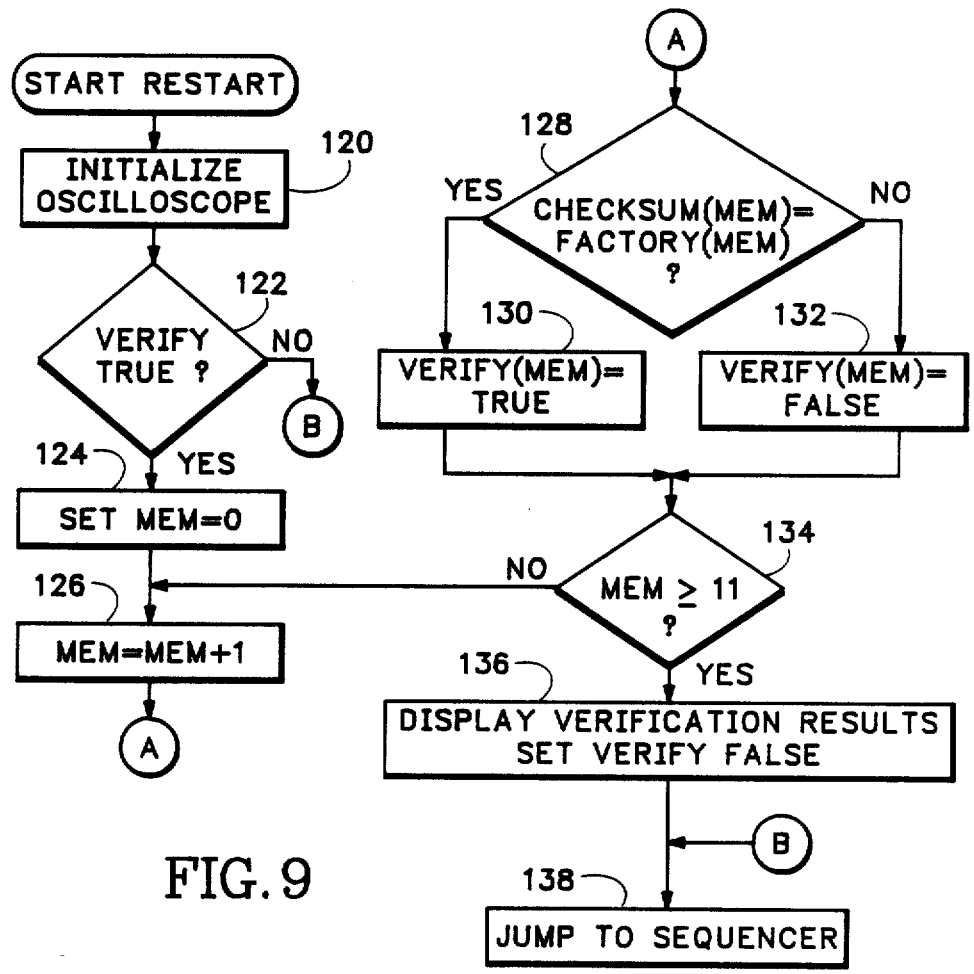
FIG. 9 is a flow chart illustrating details of the restart routine of FIG. 7.

FIG. 9 illustrates the restart routine in more detail. The restart routine is normally executed on system startup to initialize the oscilloscope in a conventional manner before jumping to the sequencer routine to initiate normal oscilloscope operation. However, if the restart routine was called by the erase routine, the VERIFY flag is true. Following oscilloscope initialization the restart routine checks the VERIFY flag and if true, performs a "checksum" operation on each of several blocks of volatile and non-volatile oscilloscope memory to verify whether the erase routine was successful. In each checksum operation, the restart routine adds the contents of all memory storage addresses within a particular block of memory and compares the result with a standard value stored in ROM. If the checksum result is equal to the standard value, the erase routine is considered to have successfully set the checksum block of memory to the desired "factory" state, free of data generated in the course of normal oscilloscope use. The save memory 22 of FIG. 1 consists of four checksum blocks (Save Page 1-4). Display memory 26, acquisition memory 14, and miscellaneous RAM 20 each comprise a separate checksum block (DISP MEM, ACQ MEM and MISC MEM) and those portions of main RAM 38 not containing preserved calibration and real-time clock data are grouped into four checksum blocks (SEQ MEM and LOCAL RAM 1-3). After performing the checksum operations, the restart program displays the results and jumps to the sequencer routine, thereby initiating normal oscilloscope operation. The checksum results are removed from the display whenever a user subsequently selects any displayed menu item.

Referring to FIG. 9, the restart routine first initializes the oscilloscope for normal operation in a conventional manner (step 120). It then checks the VERIFY flag to determine whether it is true (Step 122). If not, the restart routine jumps to the sequencer routine to initiate normal oscilloscope operation (step 138). However, if the VERIFY flag is true at step 122, the restart routine sets a counter MEM to 0 (step 124) and increments MEM by 1 (step 126). Each value of the MEM parameter refers to a separate one of the set of eleven blocks of volatile and non-volatile memory for which a checksum operation is performed. At step 128 the checksum operation is performed for memory block MEM and the result CHECKSUM(MEM) is compared to the expected checksum result FACTORY(MEM) for memory block MEM. If CHECKSUM(MEM) is equal to FACTORY(MEM), a parameter VERIFY(MEM) is set true (step 130). Otherwise, VERIFY(MEM) is set false (step 132). IF MEM is not greater than or equal to 11 (step 134), the restart routine repeats steps 126, 128, 130/132, and 134 until MEM is equal to 11. At this point, the checksum test has been performed for all eleven blocks of memory, and the restart routine generates a display on the oscilloscope indicating the results as determined from the VERIFY(MEM) parameters, as illustrated in FIG. 10. FIG. 10 shows the display as it appears when the erase routine is successful for all eleven blocks of memory. In the display, the name of each block of memory is listed, followed by the word "ERASED", indicating that portion of memory has been successfully written over. Had the erase routine been unsuccessful for any block of memory, the oscilloscope would so indicate by displaying "FAILED" instead of "ERASED" adjacent to the name of the memory block As described herein, a digital storage oscilloscope in accordance with the present invention responds to an input erase command from a user by overwriting each waveform data sequence stored in non-volatile RAM with a predetermined data sequence defining a particular, identifiable waveform display. The erase routine also overwrites other data stored in non-volatile RAM including, for example, header data associated with the displayed waveforms and data controlling or indicating current oscilloscope front panel adjustments and operating parameters. However, in the course of overwriting sensitive information stored in non-volatile RAM, the erase routine preserves certain data needed for proper continued operation such as calibration data and the realtime clock parameter. Thus, by a simple command a user can easily invoke an erase routine that overwrites sensitive waveform data in the nonvolatile memory while preserving data needed for proper oscilloscope operation.

While in the preferred embodiment the invention is implemented in a digital storage oscilloscope, it will be apparent to those skilled in the art that the invention may be practiced in connection with other instruments such as spectrum analyzers and logic analyzers which generate and store measurement data representing various observed physical phenomena in non-volatile RAM. Many other modifications are possible without departing from the invention in its broader aspects. The appended claims therefore cover all such modifications as fall within the true spirit and scope of the invention.

We claim:

1. An instrument for generating, storing and erasing measurement data representing physical phenomena, the instrument comprising:
   memory means for storing data,
   means for responding to the physical phenomena by generating and writing the measurement data representing the physical phenomena into said memory means, and
   user interface means for responding to an input erase command from a user by overwriting the measurement data stored in said memory means with predetermined data.

2. The instrument in accordance with claim 1 wherein said memory means comprises non-volatile memory.

3. The instrument in accordance with claim 1 wherein said user interface means further comprises:
   means for reading data out of said memory means,
   means for performing a test to determine whether the read out data differs from said predetermined data, and
   means for initiating a display indicating a result of the test.

4. The instrument in accordance with claim 3 wherein said performing means comprises:

means for combining the read out data to produce result data, and means for comparing the result data with a predetermined value.

5. An instrument for generating a display representing physical phenomena comprising:
   memory means for storing data;
   data acquisition and display means for responding to the physical phenomena by generating and writing into said memory means measurement data representing the physical phenomena, for reading the measurement data out of said memory means, and for generating displays including a display representing the physical phenomena in accordance with the measurement data read out; and
   user interface means for receiving an input erase command from a user and for replacing the measurement data stored in said memory means with predetermined data defining a predetermined display in response to said input erase command.

6. The instrument in accordance with claim 5 wherein said memory means comprises non-volatile memory.

7. The instrument in accordance with claim 5 wherein said user interface means further comprises:
   means for reading data out of said memory means,
   means for performing a test to determine whether the read out data differs from said predetermined data, and
   means for causing said data acquisition and display means to generate a display indicating a result of the test.

8. The instrument in accordance with claim 7 wherein said performing means comprises:
   means for arithmetically combining the read out data to produce result data, and
   means for comparing the result data with a predetermined value.

9. A digital storage oscilloscope comprising:
   data acquisition means for digitizing an input signal and generating a waveform data sequence representing the input signal,
   memory means for storing the waveform data sequence generated by said data acquisition means,
   processing means for reading out and processing the waveform data sequence stored in said memory means to produce waveform display data defining a waveform display representing the input signal,
   display means for receiving data defining displays, including the display data produced by said processing means, and for generating the displays defined by the data received, including the waveform display defined by said waveform display data, and
   user interface means for responding to an input erase command from a user by replacing the waveform data sequence stored in said memory means with a predetermined data sequence.

10. The digital storage oscilloscope in accordance with claim 9 wherein said memory means comprises non-volatile memory.

11. The digital storage oscilloscope in accordance with claim 9 wherein said user interface means also reads data out of said memory means, performs a test to determine whether the read out data differs from said predetermined data, and transmits data to said display means causing said display means to generate a display indicating a result of the test.

12. The digital storage oscilloscope in accordance with claim 11 wherein said test comprises arithmetically combining the read out data to produce result data and comparing the result data with a predetermined value.

13. A digital storage oscilloscope comprising:
    data acquisition means responsive to input control data for digitizing an input signal to generate a data sequence representing said input signal, the control data controlling at least one adjustable relationship between the input signal and the data sequence;
    memory means for storing said data sequence generated by said acquisition means and for storing a digitizer configuration parameter;
    processing means for reading out and processing the data sequence stored in said memory means to produce display data defining a waveform display representing the input signal;
    display means for receiving data defining displays, including the display data produced by said processing means, and for generating displays defined by the data received, including the waveform display defined by said display data, and
    user interface means for receiving commands from a user, for altering a value of said digitizer configuration parameter in accordance with one of said commands, for generating and transmitting the control data input to said acquisition means in accordance with the value of said digitizer configuration parameter stored in said memory means, and for replacing the waveform data sequence and said digitizer configuration parameter stored in said memory means with predetermined data in response to another of the commands from the user.

14. The digital storage oscilloscope in accordance with claim 13 wherein said memory means comprises non-volatile memory.

15. The digital storage oscilloscope in accordance with claim 13 wherein said user interface means also reads data out of said memory means, performs a test to determine whether the read out data differs from said predetermined data, and transmits data to said display means causing said display means to generate a display indicating a result of the test.

16. The digital storage oscilloscope in accordance with claim 15 wherein said test comprises arithmetically combining the read out data to produce result data and comparing the result data with a predetermined value.

17. For a digital storage oscilloscope the method of operation comprising the steps of:
    digitizing an input signal to produce data representing the input signal,
    storing the data in a memory,
    reading out and processing the data sequence in the memory to produce a display based on the data, and
    responding to an input command from a user by overwriting the data stored in the memory with a predetermined data defining a predetermined display pattern.

18. The method of operation in accordance with claim 17 further comprising the steps of:
    reading data out of said memory,
    performing a test to determine whether the read out data differs from said predetermined data, and
    generating a display indicating a result of the test 19. The method of operation in accordance with claim 18 wherein the step of performing a test comprises the substeps of:
    arithmetically combining the read out data to produce a result value, and
    comparing the result value to a predetermined value.

* * * * *